(12) United States Patent
Mckay et al.

(10) Patent No.: US 10,756,613 B2
(45) Date of Patent: Aug. 25, 2020

(54) CONTROLLING CURRENT FLOW BETWEEN NODES WITH ADJUSTABLE BACK-GATE VOLTAGE

(71) Applicant: MARVELL INTERNATIONAL LTD., Hamilton (BM)

(72) Inventors: Thomas G. Mckay, Boulder Creek, CA (US); Huaijin Chen, Tracy, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 270 days.

(21) Appl. No.: 15/886,322

(22) Filed: Feb. 1, 2018

(65) Prior Publication Data
US 2019/0238044 A1 Aug. 1, 2019

(51) Int. Cl.
*H02M 1/00* (2006.01)
*H03K 17/00* (2006.01)
*H01L 29/786* (2006.01)

(52) U.S. Cl.
CPC ............ *H02M 1/00* (2013.01); *H01L 29/786* (2013.01); *H03K 17/00* (2013.01); *H02M 2001/0077* (2013.01)

(58) Field of Classification Search
CPC .............................................. H03K 2217/0018
USPC ......................................... 327/534, 535, 537
See application file for complete search history.

(56) References Cited

U.S. PATENT DOCUMENTS

| | | | | |
|---|---|---|---|---|
| 5,663,589 A * | 9/1997 | Saitoh | ................. | H01L 27/0814 257/261 |
| 6,292,056 B1 * | 9/2001 | Hallen | ................. | H03F 3/45103 330/252 |
| 6,353,357 B1 * | 3/2002 | Kaiser | ................. | H03K 19/0027 326/34 |
| 6,466,077 B1 * | 10/2002 | Miyazaki | ................. | G05F 3/205 326/33 |
| 8,659,346 B2 * | 2/2014 | Ogawa | ..................... | G05F 3/205 327/534 |
| 9,201,440 B2 * | 12/2015 | Makiyama | ............... | G05F 1/625 |
| 9,385,708 B2 * | 7/2016 | Agrawal | ............ | H03K 17/6872 |
| 9,899,988 B2 * | 2/2018 | Yu | ........................... | H03K 17/10 |
| 10,236,872 B1 * | 3/2019 | Willard | ............... | H03K 17/6874 |
| 2002/0044076 A1 * | 4/2002 | Yao | .................. | H03K 17/04106 341/136 |
| 2002/0140458 A1 * | 10/2002 | Sato | .................. | H03K 19/01707 326/108 |
| 2003/0005378 A1 * | 1/2003 | Tschanz | ......... | G01R 31/318575 714/726 |
| 2006/0017494 A1 * | 1/2006 | Horiguchi | .......... | H03K 19/0013 327/538 |

(Continued)

*Primary Examiner* — Adam D Houston

(57) ABSTRACT

Embodiments of the present disclosure provide a circuit structure including: a first transistor having a gate terminal, a source terminal, a drain terminal, and a back-gate terminal electrically coupled to an adjustable voltage source. The gate terminal of the first transistor is electrically coupled to a first node having a first bias voltage. A second transistor has a gate terminal, a source terminal electrically coupled to the drain terminal of the first transistor, a drain terminal, and a back-gate terminal electrically connected to the adjustable voltage source. The gate terminal of the second transistor is electrically coupled to a second node having a second bias voltage. The adjustable voltage source is selectable between a first voltage and a second voltage to control a threshold voltage of the first transistor and a threshold voltage of the second transistor.

20 Claims, 9 Drawing Sheets

(56) References Cited

U.S. PATENT DOCUMENTS

| | | | |
|---|---|---|---|
| 2006/0091936 A1* | 5/2006 | Ikenaga | H03K 19/0013 327/534 |
| 2007/0267701 A1* | 11/2007 | Sung | H01L 27/0266 257/365 |
| 2009/0160531 A1* | 6/2009 | Law | H01L 27/0928 327/534 |
| 2011/0205673 A1* | 8/2011 | Okushima | H03K 19/003 361/56 |
| 2011/0260780 A1* | 10/2011 | Granger-Jones | H03K 17/102 327/537 |
| 2013/0020644 A1* | 1/2013 | Horita | G11C 11/412 257/351 |
| 2014/0008732 A1* | 1/2014 | Hyvonen | H01L 27/088 257/390 |
| 2014/0009214 A1* | 1/2014 | Altunkilic | H03K 17/161 327/427 |
| 2014/0023173 A1* | 1/2014 | Miyake | G11C 19/28 377/54 |
| 2015/0028930 A1* | 1/2015 | Le Tual | H03K 5/134 327/280 |
| 2015/0054571 A1* | 2/2015 | Watanabe | H02M 3/073 327/536 |
| 2015/0263707 A1* | 9/2015 | Kumar | H03K 3/3565 327/205 |
| 2015/0326207 A1* | 11/2015 | Yu | H03K 17/10 343/745 |
| 2017/0154909 A1* | 6/2017 | Ishizu | G09G 3/3648 |
| 2017/0186473 A1* | 6/2017 | Ikeda | G11C 11/4074 |
| 2017/0271516 A1* | 9/2017 | Onuki | G11C 16/0433 |
| 2018/0048305 A1* | 2/2018 | Jin | H03K 17/687 |
| 2018/0131369 A1* | 5/2018 | Popplewell | H01L 29/78639 |
| 2019/0238044 A1* | 8/2019 | Mckay | H01L 29/786 |
| 2019/0280019 A1* | 9/2019 | Yamazaki | H01L 29/66969 |
| 2019/0305768 A1* | 10/2019 | Willard | H01L 27/1203 |
| 2019/0386005 A1* | 12/2019 | Madan | H01L 23/66 |

\* cited by examiner

CONTROLLING CURRENT FLOW BETWEEN NODES WITH ADJUSTABLE BACK-GATE VOLTAGE

TECHNICAL FIELD

Embodiments of the disclosure relate generally to controlling current flow between input and output nodes, and more particularly, to circuit structures for controlling current flow with adjustable back-gate voltages, and methods of operating the same. The various embodiments described herein can be used in a variety of applications, e.g., providing the functional equivalent of a transistor in a circuit structure with signal greater reliability.

BACKGROUND

In electrical hardware, a transistor is a critical component for implementing digital and analog circuitry designs. Generally, a transistor includes three electrical terminals: a source, a drain, and a gate. By applying different voltages to the gate terminal, the flow of electric current between the source terminal and the drain terminal of the transistor can be switched on or off. The presence or absence of an applied voltage at the gate terminal of a transistor can be identified as "on" and "off" states of the transistor. Thus, transistors can serve as a switching element in various circuit designs, e.g., by manipulating a voltage applied to the gate of each transistor and thereby affecting the flow of electrical current between source and drain terminals of each transistor. These attributes cause a transistor to be a fundamental component in electronic circuitry, e.g., radio frequency (RF) amplifiers, transmitters, oscillators, filters, etc.

Over time transistors have become more specialized in their design to meet different circuit requirements. Some low voltage semiconductor-on-insulator (SOI) complementary metal-oxide semiconductors (CMOS) processes require the use of high voltage circuit blocks, or charge pumps to perform necessary applications. Techniques and other devices presently exist that use low voltage devices in high voltage charge pumps. However, these low voltage devices have characteristics that make their use undesirable at high voltages. The use of Low voltage devices at high voltages requires the use of many stages and other circuit components, including capacitors, to reduce the possibility of circuit failure when using high voltages. The use and number of these components and stages reduce area efficiency and decreases the power efficiency of the circuit. In some cases, the use of low voltage tolerant devices at high voltages, could lead to component failure.

SUMMARY

A first aspect of the present disclosure provides a circuit structure including: a first transistor having a gate terminal, a source terminal, a drain terminal, and a back-gate terminal electrically coupled to an adjustable voltage source, wherein the gate terminal of the first transistor is electrically coupled to a first node having a first bias voltage; and a second transistor having a gate terminal, a source terminal electrically coupled to the drain terminal of the first transistor, a drain terminal, and a back-gate terminal electrically connected to the adjustable voltage source, wherein the gate terminal of the second transistor is electrically coupled to a second node having a second bias voltage, and wherein the adjustable voltage source is selectable between a first voltage and a second voltage to control a threshold voltage of the first transistor and a threshold voltage of the second transistor.

A second aspect of the present disclosure provides a circuit structure including: first transistor having a gate terminal, a fully depleted semiconductor insulator (FDSOI) channel region positioned between a source terminal and a drain terminal, a back-gate terminal, separated from the FDSOI channel region with a buried insulator layer positioned beneath the FDSOI channel region, wherein the back-gate terminal is electrically coupled to an adjustable voltage source, and the gate terminal is electrically coupled to a first node having a first bias voltage; and a second transistor having a gate terminal, a source terminal electrically coupled to the drain terminal of the first transistor, a drain terminal, a FDSOI channel region positioned between the source and drain terminal, and a buried insulator positioned beneath the FDSOI channel region and a back-gate terminal, wherein the back-gate terminal is electrically connected to the adjustable voltage source, and a second node having a second bias voltage is electrically coupled to the gate terminal of the second transistor, and wherein the adjustable voltage source is selectable between a first voltage and a second voltage to control a threshold voltage of the first transistor and a threshold voltage of the second transistor.

A third aspect of the present disclosure provides a method for adjusting current flow between an input node and an output node, the method including: applying a first bias voltage to a first node electrically coupled to a gate terminal of a first transistor, wherein the first transistor further includes a source terminal electrically coupled to the input node, a drain terminal, and a back-gate terminal electrically coupled to an adjustable voltage source; applying a second biasing voltage to a second node electrically coupled to a gate terminal of a second transistor, wherein the second transistor further includes a source terminal electrically coupled to the drain terminal of the first transistor, a drain terminal electrically coupled to the output node, and a back-gate terminal electrically coupled to the adjustable voltage source; and shifting the adjustable voltage source from a first voltage to a second voltage, wherein the shifting reduces a threshold voltage of the first transistor to less than the first biasing voltage of the first node and reduces a threshold voltage of the second transistor to less than the second biasing voltage of the second node.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
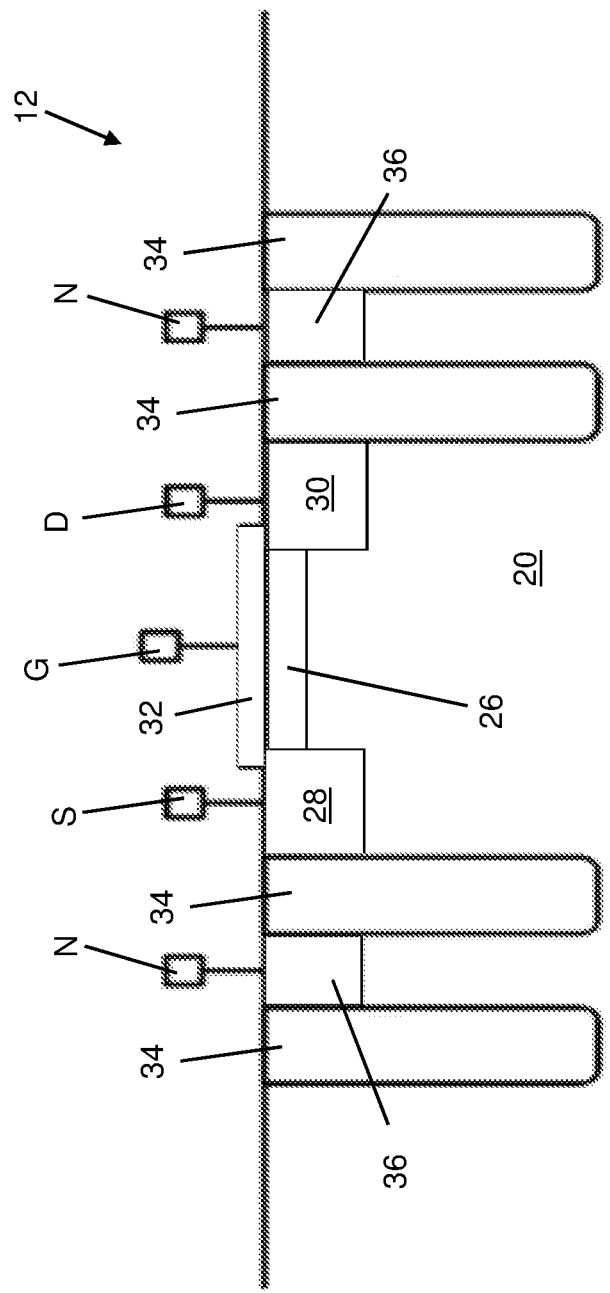
FIG. 1 shows a cross-sectional view of a conventional transistor structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The following description describes various embodiments of a macro-transistor. A macro-transistor is comprised of at least two electrically coupled transistors. Each individual transistor has a gate terminal and a back-gate terminal where voltage can be applied. This transistor structure, found in FDSOI transistors, varies significantly from conventional transistors structure as described herein. An adjustable voltage is applied to each of the back-gate terminals of the transistors and is generally used as the primary driving gate. A biasing voltage is applied to each of the gate terminals at different levels to evenly distribute the drain-source voltage of the individual transistors. This effectively changes the threshold voltage of the back-gate terminals of the individual transistors and controls the flow of current through the macro transistor. This macro transistor circuit structure allows a low voltage device to function at high voltages, such as with charge pumps, without the use of multiple stages and extra components as required in traditional circuit structures performing similar processes. Reducing the number of stages and components not only increases power efficiency, but also reduces the overall volume of the circuit structure.

Referring to FIG. 1, a conventional transistor 12 is depicted as an example to emphasize structural and operational differences relative to embodiments of the present disclosure, and transistor elements included therein. Conventional transistor 12 may be fabricated, e.g., by way of conventional fabrication techniques which may operate on a bulk silicon substrate. Conventional transistor 12 thus may be formed in a substrate 20 including, e.g., one or more semiconductor materials. Substrate 20 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 20 or a portion thereof may be strained.

Source and drain nodes S, D of conventional transistor 12 may be coupled to regions of substrate 20 which include conductive dopants therein, e.g., a source region 28 and a drain region 30 separated by a channel region 26. A gate region 32 formed on channel region 26 can be coupled to a gate node G to control a conductive channel within channel region 26. A group of trench isolations 34 may be formed from electrically insulating materials such that regions 26, 28, 30 are laterally separated from parts of other transistors. As shown, trench isolations 34 form an insulating barrier between terminals 36 and regions 26, 28, 30 and/or other elements. Further features of each element in conventional transistor 12 (e.g., function and material composition) are described in detail elsewhere herein relative to similar components in an FDSOI transistor 102 (FIG. 2) according to embodiments of the disclosure.

Figure 2:
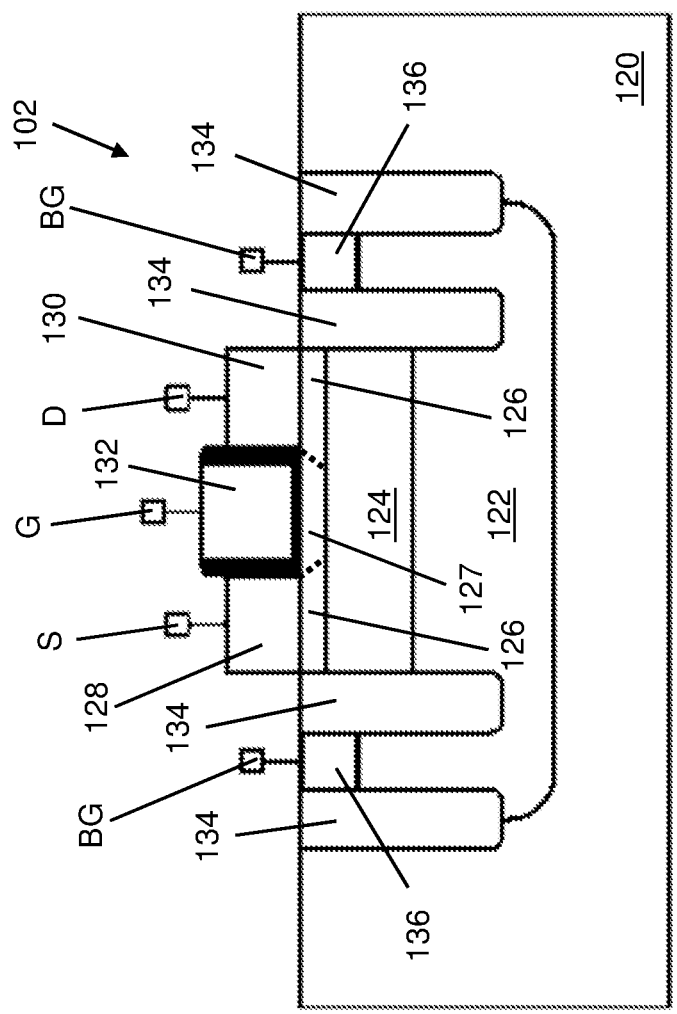
FIG. 2 shows a cross-sectional view of a fully depleted SOI (FDSOI) transistor structure with a back-gate region beneath a buried insulator layer according to embodiments of the disclosure.

Turning to FIG. 2, a cross-sectional view of a type of fully depleted semiconductor on insulator (FDSOI) transistor 102 which may be deployed, e.g., in structures and methods according to the disclosure, is shown. FDSOI transistor 102 can be formed with structural features for reducing the electrical resistance across source and drain terminals S, D thereof. FDSOI transistor 102 and components thereof can be formed on and within a substrate 120. Substrate 120 can include any currently known or later-developed semiconductor material including, without limitation, one or more of the example semiconductor materials described elsewhere herein relative to substrate 20 (FIG. 1). A back-gate region 122, alternatively identified as an n-type or p-typed doped well region, of substrate 120 can be implanted or formed in-situ during deposition with one or more doping compounds to change the electrical properties thereof. Doping generally refers to a process by which foreign materials ("dopants") are added to a semiconductor structure to alter its electrical properties, e.g., resistivity and/or conductivity. Where a particular type of doping (e.g., p-type or n-type) doping is discussed herein, it is understood that an opposite doping type may be implemented in alternative embodiments. Implantation refers to a process in which ions are accelerated toward a solid surface to penetrate the solid up to a predetermined range based on the energy of the implanted ions. Thus, back-gate region 122 can include the same material composition as the remainder of substrate 120, but can additionally include dopant materials therein. A buried insulator layer 124, also known in the art as a "buried oxide" or "BOX" layer, can separate back-gate region 122 of substrate 120 from source/drain regions 126 and a channel region 127 of FDSOI transistor 102. Buried insulator layer 124 therefore may be composed of one or more oxide compounds, and/or any other currently known or later-developed electrically insulative substances. Having Buried insulator layer 124 in a thin layer below the channel region 127 and extending below the source/drain regions 126 eliminates the need to add dopants to channel region 127. FDSOI transistor 102 therefore can be embodied as a "fully-depleted semiconductor on insulator" (FDSOI) structure, distinguishable from other structures (e.g., conventional transistor 12 (FIG. 1)) by including a dopant depleted channel region 127, buried insulator layer 124, back-gate nodes BG, etc., thereby allowing technical advantages such as an adjustable electric potential within back-gate region 122 of FDSOI transistor 102 as discussed elsewhere herein. Although FDSOI transistor 102 is shown and described as being formed with a particular arrangement of substrate 120, back-gate regions 122, and buried insulator layer 124, it is understood that FDSOI transistor 102 may alternatively be structured as a fin transistor, a nanosheet transistor, a vertical transistor, and/or one or more other currently-known or later-developed transistor structures for providing a back-gate terminal for adjusting the transistor's threshold voltage.

Source/drain regions 126 and channel region 127 may electrically couple a first drain terminal 128 of FDSOI transistor 102 to a second drain terminal 130 of FDSOI transistor 102 when the transistor is in an on state. A gate stack 132 can be positioned over channel region 127, such that a voltage of gate node G controls the electrical conductivity between first and second drain terminals 128, 130 through source/drain regions 126 and channel region 127. Gate stack 132 can have, e.g., one or more electrically conductive metals therein, in addition to a gate dielectric material (indicated with black shading between bottom of stack and channel region 127) for separating the conductive metal(s) of gate stack 132 from at least channel region 127. A group of trench isolations 134, in addition, can electrically and physically separate the various regions of FDSOI transistor 102 from parts of other transistors. Trench isolations 134 may be composed of any insulating material such as $SiO_2$ or a "high-k" dielectric having a high dielectric constant, which may be, for example, above 3.9. In some situations, trench isolations 134 may be composed of an oxide substance. Materials appropriate for the composition of trench isolations 134 may include, for example, silicon dioxide ($SiO_2$), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

Back-gate region 122 can be electrically coupled to back-gate node BG through back-gate terminals 136 within substrate 120 to further influence the characteristics of amplifier circuit 102, e.g., the conductivity between first and second drain terminals 128, 130 through source/drain regions 126 and channel region 127. Applying an electrical potential to back-gate terminals 136 at back-gate node BG can induce an electric charge within back-gate region 122, thereby creating a difference in electrical potential between back-gate region 122 and source/drain regions 126, channel region 127, across buried insulator layer 124. Among other effects, this difference in electrical potential between elements, including back-gate region 122 and source/drain regions 126, channel region 127, and of substrate 120, can affect the threshold voltage of FDSOI transistor 102, i.e., the minimum voltage for inducing electrical conductivity across source/drain and channel regions 126, 127 between first and second drain terminals 128, 130 as discussed herein. In particular, applying a back-gate biasing voltage to back-gate terminals 136 can lower the threshold voltage of FDSOI transistor 102, thereby reducing source drain resistance and increasing drain current, relative to the threshold voltage of FDSOI transistor 102 when an opposite voltage bias is applied to back-gate terminals 136. This ability of FDSOI transistor 102, among other things, can allow a reduced width (saving silicon area) relative to conventional applications and transistor structures. In an example embodiment, a width of source/drain and channel regions 126, 127 (i.e., into and out of the plane of the page) can be between approximately 0.3 micrometers (μm) and approximately 2.4 μm. A length of source/drain and channel regions 126, 127 (i.e., left to right within the plane of the page) between first and second drain terminals 128, 130 can be, e.g., approximately twenty nanometers (nm). FDSOI technology transistors, e.g., FDSOI transistor 102, offer the ability to apply a voltage bias to back-gate region 122 to manipulate the threshold voltage $V_t$ (i.e., minimum voltage for channel activation) of FDSOI transistor 102. As described herein, applying calibration voltages to back-gate region 122 can allow a user to reduce the local oscillator (LO) leakage and improve the linearity of an electronic transmitter. Back-gate region 122 can be coupled to an adjustable voltage to permit adjustment and calibration of the threshold voltage of FDSOI transistor 102. In circuit schematics shown in the accompanying FIGS. 3-4 and 6-8, any transistor which includes a back-gate terminal can be an embodiment of FDSOI transistor 102. Other transistors without back-gate terminals, by comparison, may alternatively take the form of any currently known or later developed transistor structure configured for use in a structure with FDSOI transistors 102.

Figure 3:
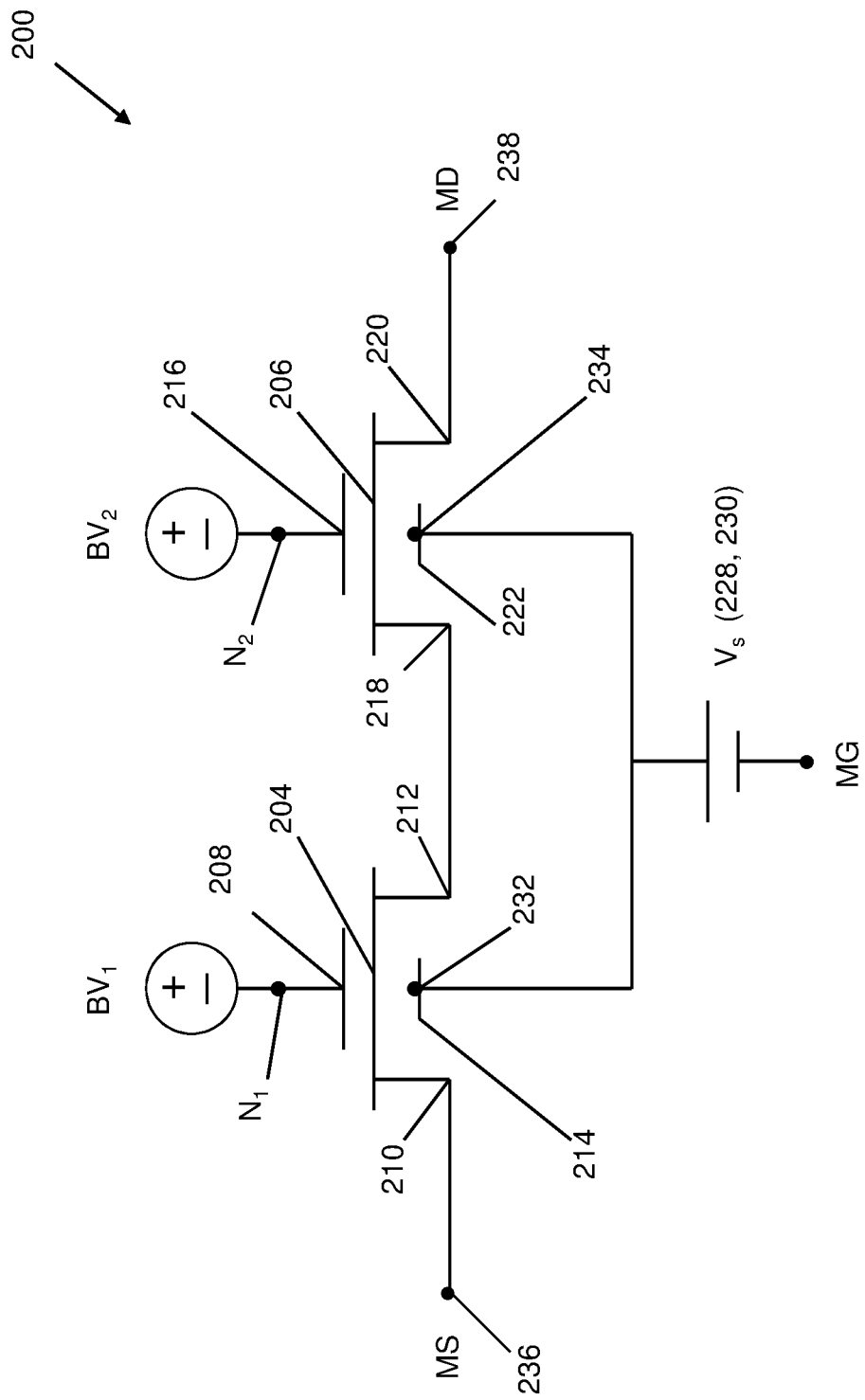
FIG. 3 shows a schematic view of a circuit structure according to embodiments of the disclosure.

FIG. 3 depicts an embodiment of the basic macro-transistor 200 circuit structure. The technical advantages and features described herein can be attainable by using embodiments of the FDSOI transistor 102 (FIG. 2) for each individual transistor element of macro-transistor 200 circuit structure. Although FDSOI transistor 102 is shown in FIG. 2, it is understood that FDSOI transistor 102 may alternatively be structured as a fin transistor, a nanosheet transistor, a vertical transistor, and/or one or more other transistor described as being formed with a particular arrangement of a gate terminal, also referred to as a gate stack 132 in FIG. 2, and a back-gate terminal 136. The macro-transistor 200 of FIG. 3 can include, a first transistor 204 and a second transistor 206, each having a possible configuration depicted in FIG. 2. First transistor 204 may include a gate terminal 208, a source terminal 210, a drain terminal 212, and a back-gate terminal 214. The second transistor may include a gate terminal 216, a source terminal 218, a drain terminal 220, and a back-gate terminal 222. In FIG. 3, the drain terminal 212 of first transistor 204 can be electrically coupled to source terminal 218 of second transistor 206, allowing source terminal 210 to act as a macro-source (MS) of the macro-transistor 200 and drain terminal 220 to act as a macro-drain (MD) of the macro transistor. Back-gate terminals 214 and 222 are electrically coupled to an adjustable voltage source $V_s$. During operational conditions, back-gate terminals 214 and 222 are act as a macro-gate (MG) of macro-transistor 200. Gate terminal 208 of first transistor 204 is electrically coupled to a first node $N_1$ where a first biasing voltage $BV_1$ can be applied. Gate terminal 216 of second transistor 206 is electrically coupled to a second node $N_2$, where a second biasing voltage $BV_2$ can also be applied. Biasing voltages $BV_1$ and $BV_2$ are varied at different voltages using other circuit components, including but not limited to diodes, diode-connected MOS transistors, resistors, or any combination of these components, to allow the drain to source voltage $V_{ds}$, also referred to as the threshold voltage, of the individual transistors to be evenly distributed. The threshold voltage controls the flow of current in transistor channel region 26, as viewed in FIG. 2. The number of individual transistors in macro circuit 200 is dependent on the threshold voltage each individual transistor experiences during circuit operation. First and second biasing voltages $BV_1$ and $BV_2$ maintain the threshold voltage of the individual transistors to be within the individual transistors' breakdown limits. The adjustable voltage source $V_s$ may be adjustable between at least a first voltage 228 and a second voltage 230 to regulate the threshold voltage (232, 234, respectively) of the individual transistors 204 and 206.

In one embodiment, the circuit structure of macro-transistor 200 may be configured to allow a first voltage 228 of adjustable voltage source $V_s$ to increase the threshold voltage 232 of first transistor 204 to more than first bias voltage $BV_1$. This configuration can also increase threshold voltage 234 of second transistor 206 to an amount greater than second bias voltage $BV_2$. A second voltage 230 of the adjustable voltage source $V_s$ can also be configured to reduce threshold voltage 232 of first transistor 204 to an amount less than first bias voltage $BV_1$. This configuration using second voltage 232 also reduces the threshold voltage of the second transistor to less than the second bias voltage.

While FIG. 3 provides an example of a PMOS macro-transistor, situations where NMOS transistors and materials are used, the embodiments discussed herein may also be configured to form a NMOS macro-transistor.

Figure 4:
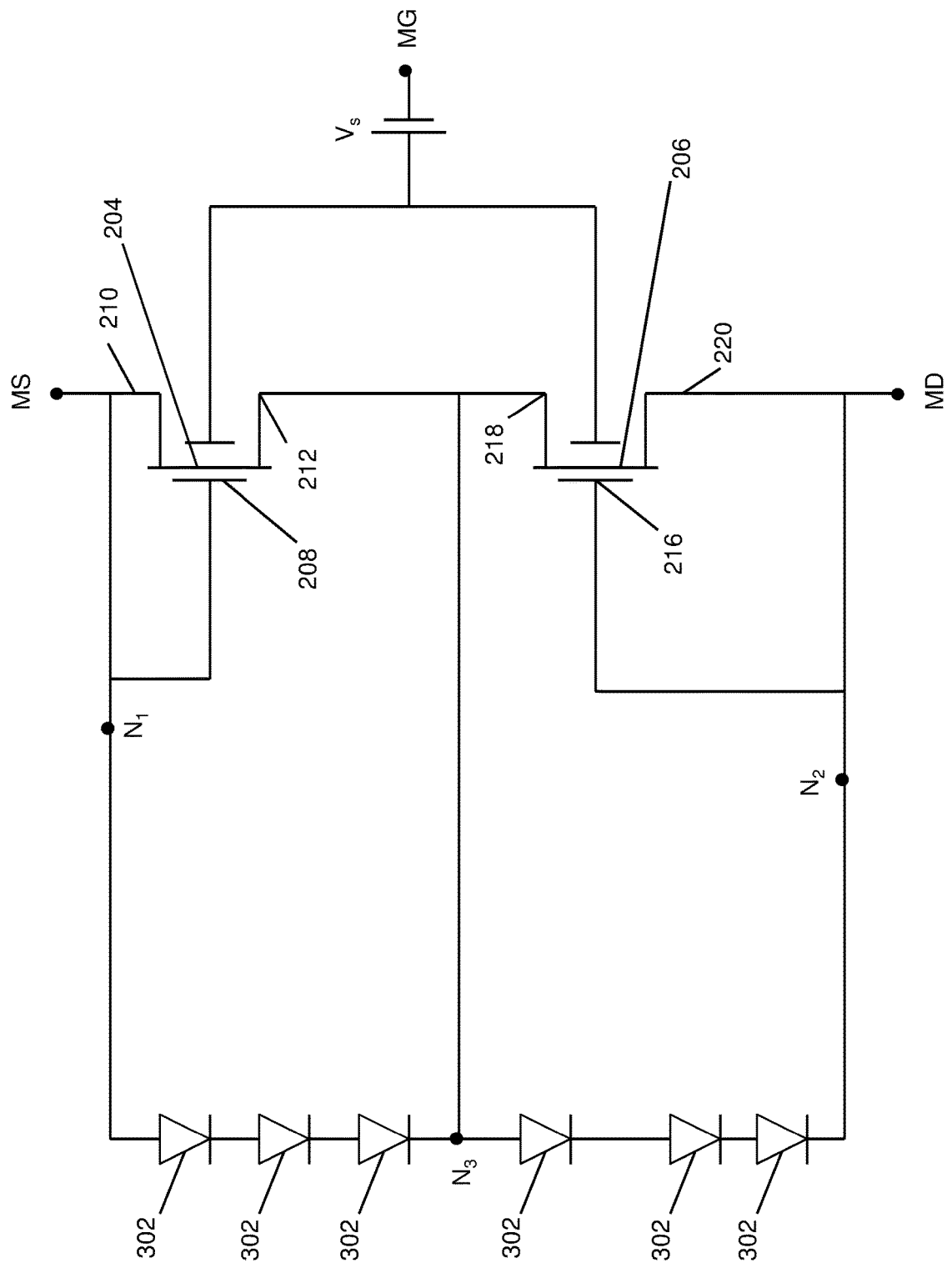
FIG. 4 shows a schematic view of the circuit structure with diodes according to embodiments of the disclosure.

FIG. 4 demonstrates an embodiment of macro-transistor 200 using diodes 302 to bias gate terminals 208 and 216. Referring to FIGS. 3-4, first node $N_1$ may be positioned proximate to source terminal 210 of first transistor 204, and electrically coupled to gate terminal 208, where first biasing voltage $BV_1$ may be applied as shown in FIG. 3. First node $N_1$ is electrically coupled to second node $N_2$ through at least one diode 302, though a plurality of diodes may be used as shown in FIG. 4. Second node $N_2$ can be electrically coupled to gate terminal 216 and drain source 220 of second transistor 206. When a plurality of diodes 302 or other electrical components are used, such as resistors and any other type of transistors, a third node $N_3$ may exist between the diodes 302 or other electrical components. This third node $N_3$ can be electrically connected to either drain terminal 212 of first transistor 204 or source terminal 218 of second transistor 206 depending on desired threshold voltage 232, 234 of first and second transistor 204 and 206 respectively, as generally shown in FIG. 2. While the polarity described above can be viewed as PMOS, NMOS polarity and orientation may also be used.

Figure 5:
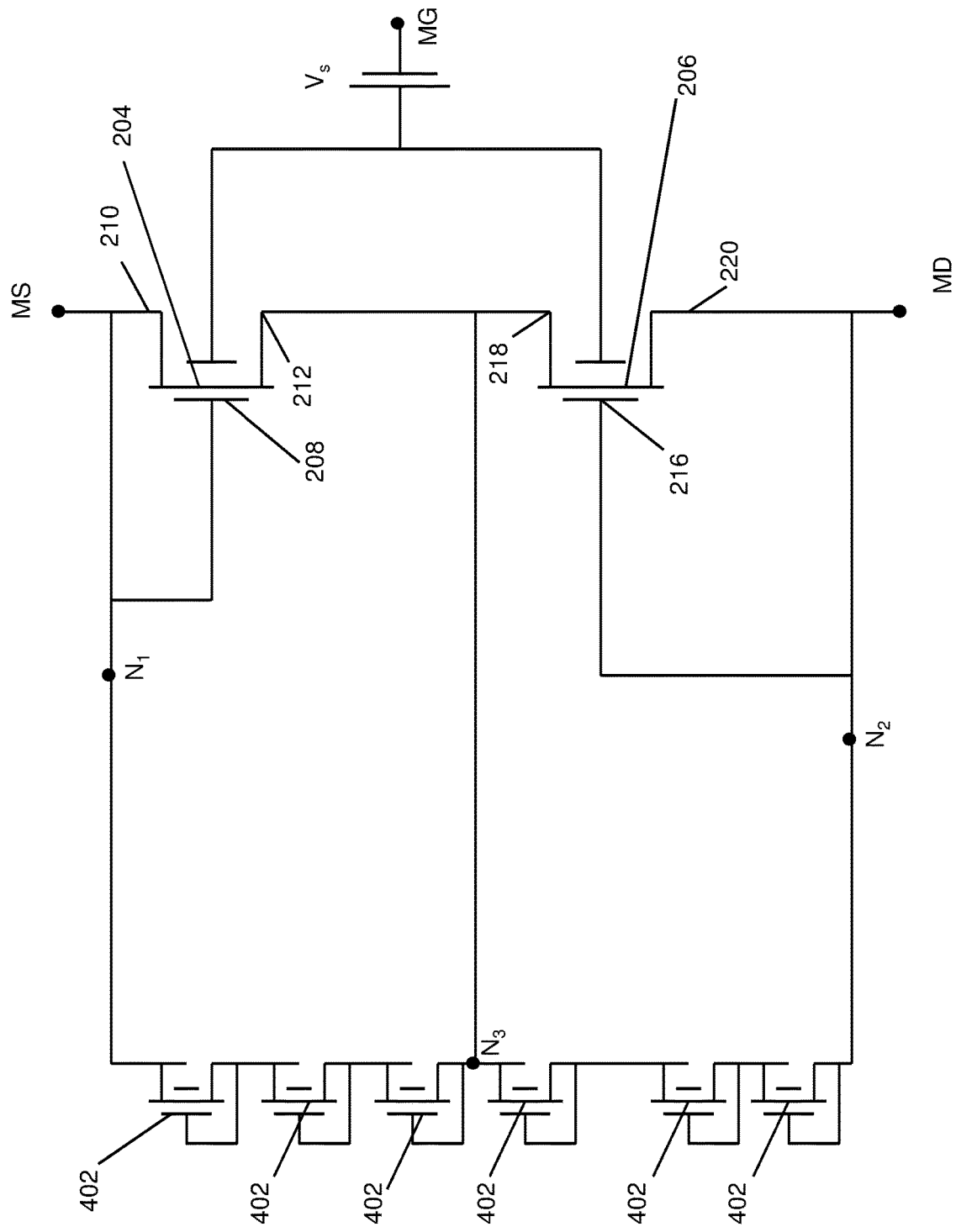
FIG. 5 shows a schematic view of the circuit structure with bias-regulating transistors according to embodiments of the disclosure.

FIGS. 3 and 5 together provides an alternative embodiment of a macro-transistor using bias-regulating transistors 402 to influence first and second biasing voltages $BV_1$ and $BV_2$. First node $N_1$ may be positioned near source terminal 210 of first transistor 204, and can be electrically coupled to gate terminal 208. First node $N_1$ can also be electrically coupled to second node $N_2$, positioned near drain terminal 220 of the second transistor 206, through at least one bias-regulating transistor 402. FIG. 5 demonstrates how a plurality of bias-regulating transistors 402, connected in series between first node $N_1$ and second node $N_2$, may be configured. In addition, a plurality of bias-regulating transistors may also be arranged in parallel to additionally affect the voltage and current of macro-transistor 200. When a plurality of bias-regulating transistors 402 are used, additional nodes, such as a third node $N_3$ existing between two bias-regulating transistors 402, may be electrically coupled to drain terminal 212 of first transistor 204 and/or the source terminal 218 of the second transistor 206, as generally shown in FIG. 5.

Figure 6:
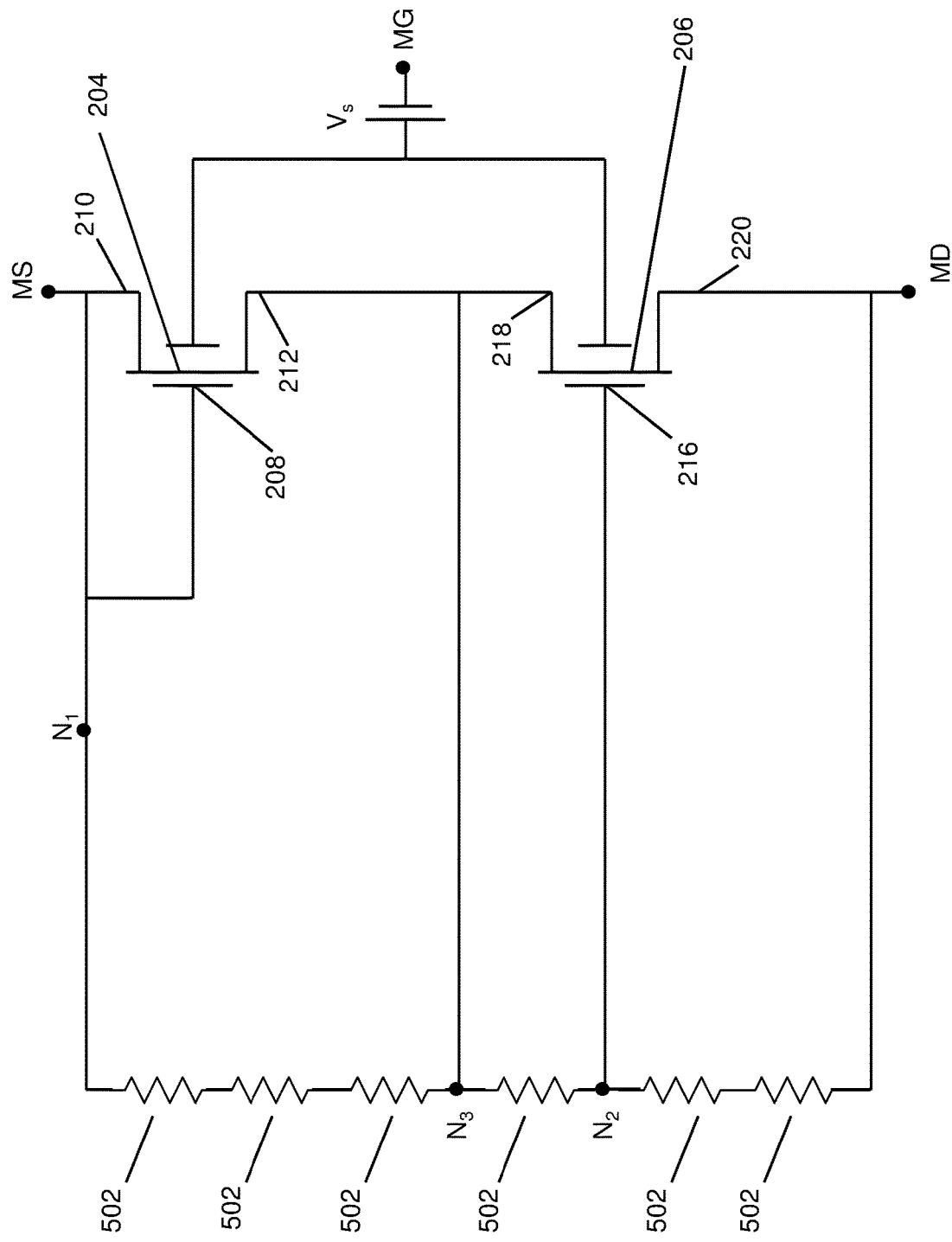
FIG. 6 shows a schematic view of the circuit structure with voltage-dividing resistors according to embodiments of the disclosure.

Regarding FIGS. 3 and 6 together, provides an alternative embodiment of a macro-transistor that can use voltage dividers or resistors to influence the first and second biasing voltage $BV_1$, $BV_2$ depending on circuit structure's purposed use. First node $N_1$ may be positioned at gate terminal 210 of first transistor 204. First node $N_1$ may be electrically coupled to a second node $N_2$ through a voltage dividing tap 502 or other resistor configuration. The resistors of the voltage dividing tap 502 may be configured either in series or in parallel. In one embodiment, using a plurality of resistors or other electrical components, second node $N_2$ may be electrically coupled directly to gate terminal 216 of second transistor 206 and electrically coupled to drain terminal 220 of second transistor 206 through at least one resistor or other electrical component, as generally shown in FIG. 6. All of the aforementioned electrical components may be used as described above or in combination with other components.

Figure 7:
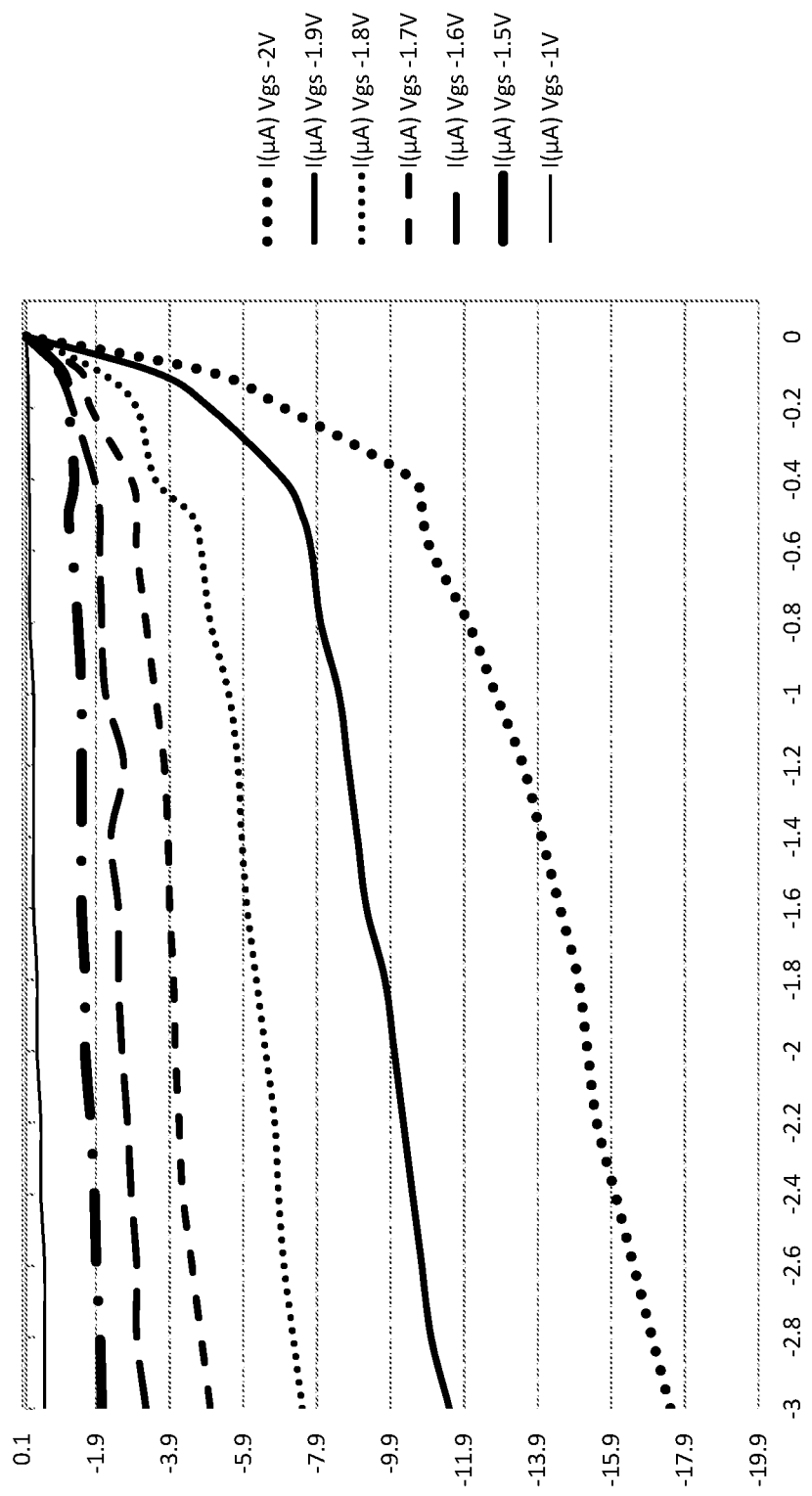
FIG. 7 shows a representative plot of current flow (in microamperes) versus input-output voltage for the circuit structure at varying back-gate voltages.

FIG. 7 depicts a plot showing that the aforementioned low voltage components of a macro-transistor are operable in circuit environments having higher voltages. The plot shows the source to gate voltage $V_{gs}$ as current $I(\mu A)$ is increased. When $V_{gs}$ increases and conductance increases a channel is formed, i.e., a macro-gate.

Figure 8:
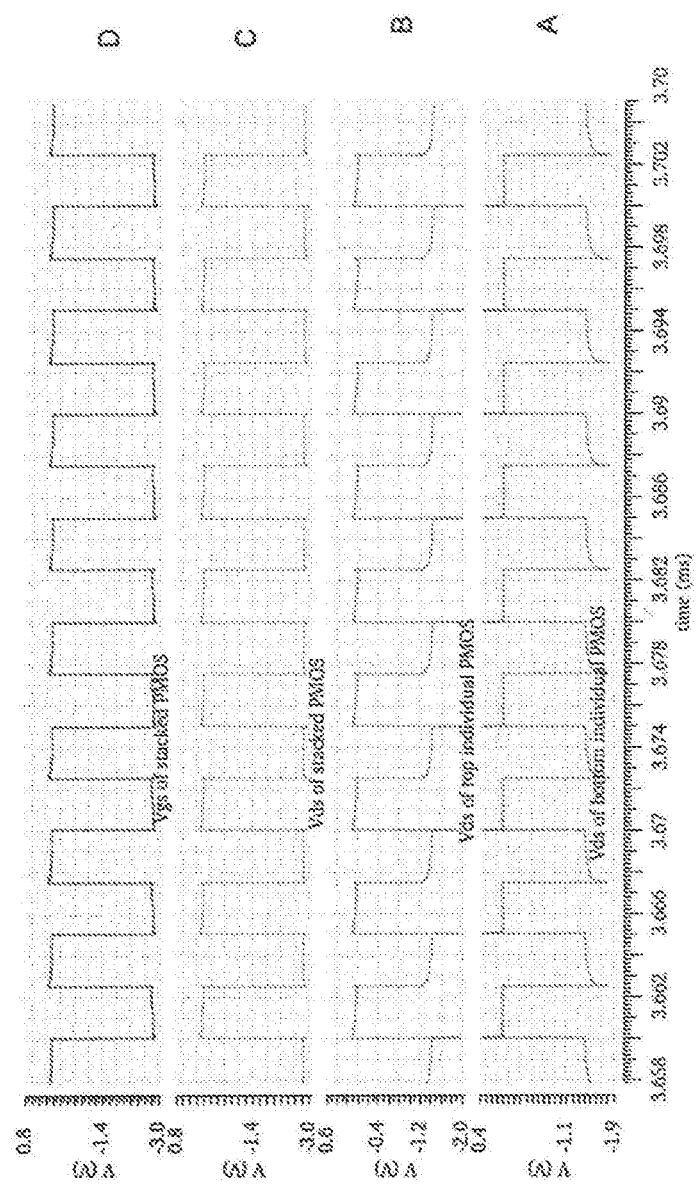
FIG. 8 shows a group of plots comparing input-output voltage for a circuit structure according to the disclosure with conventional transistor structures.

FIG. 8 shows a group of plots comparing input-output voltage for a circuit structure having a macro-transistor 200 and the individual transistors 204 and 206, as shown in FIG. 3. Plots A and B of FIG. 8 demonstrate expected behavior and threshold voltages 232, 234 at back-gate terminals 214, 222, of first and second transistor 204, 206, as shown in FIG. 3. Plots C and D of FIG. 8 demonstrate that source to gate voltage $V_{gs}$ and drain to source voltage of macro-transistor 200 behave as expected and maintain the expected voltages without breakdown of the circuit structure.

Referring to FIGS. 2-6, and 9 together, embodiments of the disclosure include methods for adjusting current flow between an input node 236 and an output node 238, e.g., through the operation of macro-transistor 200 (FIGS. 2-6) described herein. Methods according to the disclosure can include, applying a first bias voltage $BV_1$ to a first node $N_1$ electrically coupled to a gate terminal 208 of a first transistor 204, step S1. First transistor 204 may further include a source terminal 210 electrically coupled to an input node 236 a drain terminal 212, and a back-gate terminal 214 electrically coupled to an adjustable voltage source $V_s$.

A second bias voltage $BV_2$ may be applied to a second node $N_2$, step S2. Second node $N_2$ may be electrically coupled to gate terminal 216 of second transistor 206. Second transistor 206 may further include a source terminal 218 that is electrically coupled to drain terminal 220 of first transistor 204. Drain terminal 220 may be electrically coupled to output node 238, and a back-gate terminal 234. Back-gate terminal 234 can then be electrically 222 coupled to the adjustable voltage source $V_s$.

Figure 9:
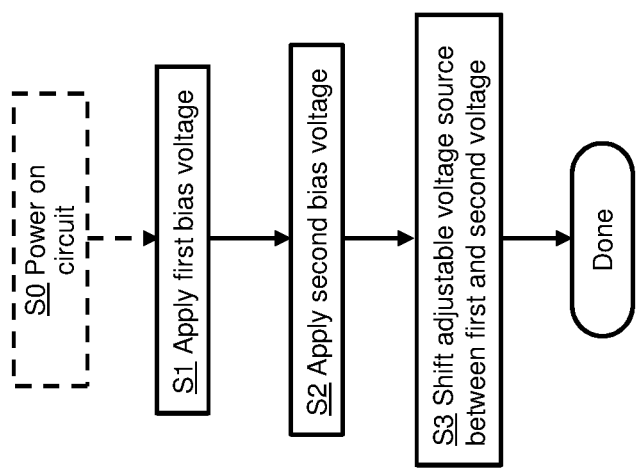
FIG. 9 shows an example of a process flow diagram for controlling current flow between input and output nodes of the circuit structure according to embodiments of the disclosure.

Adjustable voltage source $V_s$ may then be shifted from a first voltage 228 to a second voltage 230, step S3 of FIG. 9. Shifting between a first voltage 228 and a second voltage 230, reduces the threshold voltage 232 of the first transistor 204 to less than first biasing voltage $BV_1$ of first node $N_1$. This also reduces the threshold voltage 234 of second transistor 206 to less than second biasing voltage $BV_2$ of second node $N_1$. By shifting from first voltage 228 to second voltage 230 allows first and second transistors 204, 206 to operate as a single transistor or macro-transistor 200, wherein back-gate terminals 214, 222 of first and second transistor 204 and 206 may be used as a single gate terminal or macro-gate MG.

First transistor 204 and second transistor 206 may be a fully depleted semiconductor on insulator (FDSOI) transistors with a channel region 127 positioned laterally between first drain terminal 128 and second drain terminal 130, of first 204 or second transistor 206, as shown in FIGS. 2-3. A buried insulator layer 124 may be positioned beneath FDSOI channel region 127 and buried insulator layer 124. Buried oxide layer 127 separates back-gate terminal 136 of first 204 or second transistor 206 from FDSOI channel region 127.

The flowcharts and block diagrams in the Figures illustrate the layout, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
   a first transistor having a gate terminal, a source terminal, a drain terminal, and a back-gate terminal electrically coupled to an adjustable voltage source, wherein the gate terminal of the first transistor is electrically coupled to a first node having a first bias voltage; and
   a second transistor having a gate terminal, a source terminal electrically coupled to the drain terminal of the first transistor, a drain terminal, and a back-gate terminal electrically connected to the adjustable voltage source, wherein the gate terminal of the second transistor is electrically coupled to a second node having a second bias voltage, and wherein the adjustable voltage source is selectable between a first voltage and a second voltage to control a threshold voltage of the first transistor and a threshold voltage of the second transistor,
   wherein the first transistor and the second transistor each include a fully depleted semiconductor on insulator (FDSOI) channel region positioned laterally between the source terminal and the drain terminal of the first or second transistor.

2. The circuit structure of claim 1, wherein the first transistor and the second transistor each include:
   a buried insulator layer positioned directly beneath the FDSOI channel region, such that the buried insulator layer separates the back-gate terminal of the first or second transistor from the FDSOI channel region.

3. The circuit structure of claim 1, wherein the second voltage of the adjustable voltage source is configured to reduce the threshold voltage of the first transistor to less than the first bias voltage, and reduce the threshold voltage of the second transistor to less than the second bias voltage.

4. The circuit structure of claim 1, wherein the first voltage of the adjustable voltage source is configured to increase the threshold voltage of the first transistor to more than the first bias voltage, and increase the threshold voltage of the second transistor to more than the second bias voltage.

5. The circuit structure of claim 1, wherein the first node is positioned at the source terminal of the first transistor, the first node being electrically coupled to the second node through a first diode and wherein the second node is positioned at the drain terminal of the second transistor.

6. The circuit structure of claim 1, wherein the first node is positioned at the source terminal of the first transistor, the first node being electrically coupled to the second node through a bias-regulating transistor, and wherein the second node is positioned at the drain terminal of the second transistor.

7. The circuit structure of claim 1, wherein the first node having the first bias voltage is positioned at the gate terminal of the first transistor, the first node being electrically coupled to the second node through a bias-regulating transistor, and wherein the second node is positioned at the gate terminal of the second transistor.

8. The circuit structure of claim 1, wherein the first node having the first bias voltage is positioned at the gate terminal of the first transistor, the first node being electrically coupled to the second node through a voltage dividing tap, and wherein the second node is positioned at the gate terminal of the second transistor.

9. A circuit structure comprising:
   a first transistor having a gate terminal, a fully depleted semiconductor insulator (FDSOI) channel region positioned between a source terminal and a drain terminal, a back-gate terminal, separated from the FDSOI channel region with a buried insulator layer positioned beneath the FDSOI channel region wherein the back-gate terminal is electrically coupled to an adjustable voltage source, and the gate terminal is electrically coupled to a first node having a first bias voltage; and
   a second transistor having a gate terminal, a source terminal electrically coupled to the drain terminal of the first transistor, a drain terminal, a FDSOI channel region positioned between the source and drain terminal, and a buried insulator positioned beneath the FDSOI channel region and a back-gate terminal, wherein the back-gate terminal is electrically connected to the adjustable voltage source, and a second node having a second bias voltage is electrically coupled to the gate terminal of the second transistor, and wherein the adjustable voltage source is selectable between a first voltage and a second voltage to control a threshold voltage of the first transistor and a threshold voltage of the second transistor.

10. The circuit structure of claim 9, wherein the second voltage of the adjustable voltage source is configured to reduce the threshold voltage of the first transistor to less than the first bias voltage, and reduce the threshold voltage of the second transistor to less than the second bias voltage.

11. The circuit structure of claim 9, wherein the first voltage of the adjustable voltage source is configured to increase the threshold voltage of the first transistor to more than the first bias voltage, and increase the threshold voltage of the second transistor to more than the second bias voltage.

12. The circuit structure of claim 9, wherein the first node is positioned at the source terminal of the first transistor, the first node being electrically coupled to the second node through a first diode, and wherein the second node is positioned at the drain terminal of the second transistor.

13. The circuit structure of claim 9, wherein the first node is positioned at the source terminal of the first transistor, the first node being electrically coupled to the second node through a bias-regulating transistor, and wherein the second node is positioned at the drain terminal of the second transistor.

14. The circuit structure of claim 9, wherein the first node having a biased voltage is positioned at the gate terminal of the first transistor, the first node being electrically coupled to the second node through a bias-regulating transistor, and wherein the second node is positioned at the gate terminal of the second transistor.

15. The circuit structure of claim 9, wherein the first node having a biased voltage is positioned at the gate terminal of the first transistor, the first node being electrically coupled to the second node through a voltage dividing tap, and wherein the second node is positioned at the gate terminal of the second transistor.

16. The circuit structure of claim 9, wherein the source terminal of the first transistor defines a macro-source, and the drain-terminal of the second transistor defines a macro drain, wherein the macro-source and macro-drain are electrically coupled to form a macro-transistor.

17. A method for adjusting current flow between an input node and an output node, the method comprising:
applying a first bias voltage to a first node electrically coupled to a gate terminal of a first transistor, wherein the first transistor further includes a source terminal electrically coupled to the input node, a drain terminal, and a back-gate terminal electrically coupled to an adjustable voltage source;
applying a second biasing voltage to a second node electrically coupled to a gate terminal of a second transistor, wherein the second transistor further includes a source terminal electrically coupled to the drain terminal of the first transistor, a drain terminal electrically coupled to the output node, and a back-gate terminal electrically coupled to the adjustable voltage source; and
shifting the adjustable voltage source from a first voltage to a second voltage, wherein the shifting reduces a threshold voltage of the first transistor to less than the first biasing voltage of the first node and reduces a threshold voltage of the second transistor to less than the second biasing voltage of the second node,
wherein the first transistor and the second transistor each include a fully depleted semiconductor on insulator (FDSOI) channel region positioned laterally between the source terminal and the drain terminal, of the first or second transistor.

18. The method of claim 17, wherein the first transistor and the second transistor each include:
a buried insulator layer positioned directly beneath the FDSOI channel region, the buried insulator layer separating the back-gate terminal of the first or second transistor from the FDSOI channel region.

19. The method of claim 17, wherein the first node is positioned at the source terminal of the first transistor, the first node being electrically coupled to the second node through a first diode, and wherein the second node is positioned at the drain terminal of the second transistor.

20. The method of claim 17, wherein shifting from the first voltage to the second voltage causes the first and second transistors to operate as a single transistor, wherein the back-gate terminal of the first and second transistor is used as a single gate terminal.

* * * * *